United States Patent [19]

Holmberg et al.

[11] Patent Number: 4,499,557
[45] Date of Patent: Feb. 12, 1985

[54] PROGRAMMABLE CELL FOR USE IN PROGRAMMABLE ELECTRONIC ARRAYS

[75] Inventors: Scott H. Holmberg, Milford; Richard A. Flasck, Rochester, both of Mich.

[73] Assignee: Energy Conversion Devices, Inc., Troy, Mich.

[21] Appl. No.: 281,018

[22] Filed: Jul. 6, 1981

Related U.S. Application Data

[63] Continuation-in-part of Ser. No. 201,594, Oct. 28, 1980, abandoned, and Ser. No. 103,011, Dec. 13, 1979, abandoned.

[51] Int. Cl.³ .............................................. G11C 13/00
[52] U.S. Cl. .................................... 365/163; 365/174
[58] Field of Search ............................... 365/163, 103; 357/23 TF, 45

[56] References Cited

U.S. PATENT DOCUMENTS

| | | | |
|---|---|---|---|
| 3,271,591 | 9/1966 | Ovshinsky | 365/163 |
| 4,174,521 | 11/1979 | Neale | 357/45 |
| 4,203,123 | 5/1980 | Shanks | 365/163 |
| 4,217,374 | 8/1980 | Ovshinsky et al. | 427/39 |
| 4,342,044 | 7/1982 | Ovshinsky et al. | 357/2 |

*Primary Examiner*—Terrell W. Fears
*Attorney, Agent, or Firm*—Lawrence G. Norris

[57] ABSTRACT

An improved programmable cell for use in programmable electronic arrays such as PROM devices, logic arrays, gate arrays and die interconnect arrays. The cells have a highly non-conductive state settable and non-resettable into a highly conductive state. The cells have a resistance of 10,000 ohms or more in the non-conductive state which are settable into the conductive state by a threshold voltage of 10 volts or less, a current of 25 milliamps or less, for 100 microseconds or less. The cells in the conductive state have a resistance of 100 ohms or less. The cells have a maximum permittable processing temperature of 400° centigrade or more and a storage temperature of 175° centigrade or more. The cells are formed from doped silicon alloys including at least hydrogen and/or fluorine and contain from about 0.1 to 5 percent dopant. The cells can be plasma deposited from silane or silicon tetrafluoride and hydrogen with 20 to 150,000 ppm of dopant.

Each cell in an array is a thin film deposited cell and includes an isolating device which can be a bipolar or MOS device or can be a thin film diode or transistor. The associated addressing circuitry also can be conventional bipolar or MOS devices or thin film deposited devices. The cells have a cell area of less than one square mil to provide a high cell packing density.

37 Claims, 16 Drawing Figures

PROGRAMMABLE CELL FOR USE IN PROGRAMMABLE ELECTRONIC ARRAYS

CROSS REFERENCE TO RELATED APPLICATIONS

This application is a continuation-in-part of application Ser. No. 103,011 filed Dec. 13, 1979, for: DEPOSITED FILM MEMORY SYSTEMS, now abandoned, and application Ser. No. 201,594 filed Oct. 28, 1980, for: A PROGRAMMABLE CELL FOR USE IN PROGRAMMABLE ELECTRONIC ARRAYS now abandoned in favor of its continuation application, Ser. No. 649,205 filed Sept. 10, 1984.

BACKGROUND OF THE INVENTION

1. Field of the Invention

The present invention is related to an improved programmable cell for use in programmable electronic arrays such as PROM devices, logic arrays, gate arrays and die interconnect arrays. In particular each cell has a memory region made of a phase change material which is settable and non-resettable in a highly conductive state from a highly non-conductive state. This invention is related to the storing of information with phase change switch devices first invented by Stanford R. Ovshinsky, as for example, as disclosed in U.S. Pat. No. 3,271,591.

2. Description of the Prior Art

Heretofore various memory systems have been proposed which are divided into several types. One type is the serial type where the information in the memory system is obtained serially and where the read time for reading a particular bit of information in the memory is dependent upon where it is located in the memory. This results in long read times for obtaining the information from memory. Such types of memory systems include memory devices including a magnetic tape or a magnetic disc including the so-called floppy disc and magnetic "bubble memory" devices.

Another type of memory system is the random access memory system (RAM) where the read time for each bit is substantially the same as for any other bit.

While the storage information in "bubble" type memory devices potentially reduces the size and cost of memory systems and provides high information packing densities, i.e., small center-to-center distance between adjacent memory regions where the bits of information are stored, such "bubble" systems are limited to serial reading of information and do not provide for fast read, random access to the stored information.

Also, heretofore, short term data storage has been provided by RAM memory devices including transistors or capacitors at the cross over points of X and Y axis conductors. Such a memory device can be set in one of two operational states. These memory devices provide a fairly high packing density, i.e., a small center-to-center distance between memory locations. A major disadvantage is that such devices are volatile since they must be continually supplied with a voltage if they are to retain their stored data. Such short term data storage devices are often referred to as volatile fast read and write memory systems.

A fast read memory system is the read only memories (ROM) which use transistors and rectifiers formed in semiconductor substrates with permanently open contact points or permanently closed contact points for storage of bits of information. Such a ROM system is programmed during the manufacture thereof and has a short read time and a relatively high packing density as well as being non-volatile. However, the obvious disadvantage of such a ROM system is that the data stored cannot be altered in the field. Accordingly, ROM devices are made-to-order for applications involving storing of the basic operating program of a data processor or other user non-altered information.

Another memory system used is a programmable read only memory (PROM) system which can be programmed once by the user and remains in that state. Once it is programmed a PROM system will operate identically to a ROM system of the same configuration.

The most commonly used PROM system incorporates fuse links positioned at each cross over point of an X-Y matrix of conductors. The storage of information (logic one or logic zero) is obtained by blowing the fuse links in a given predetermined pattern. Such fuse links extend laterally on a substrate instead of vertically between cross over conductors and, as a result, such fuse links necessarily require a large area. The area of a typical memory cell or region utilizing a fuse link is about 1 to 1.6 mil$^2$ (1 mil=0.001 inch).

The current needed to blow the fuse link for programming is quite high because of the necessity of completely blowing out the fuse link and because of the inherently high conductivity of the material of the fuse link. Typical currents are 50 milliamps and the power required is approximately 250 to 400 milliwatts. Also, the fuse link which is a narrow portion of a conductor deposited on a substrate, must have a precise dimension to ensure the complete and programmable blow out thereof. In this respect, photolithography and etching techniques required to fabricate such a fuse link require that such a fuse link be made with very critical tolerances in width, length and thickness.

Another major problem with fuse link type PROM devices is that the small gap in the blown fuse can become closed with accumulation of conductive material remaining adjacent to the gap by diffusion or otherwise.

The fuse link technology also has been utilized in field programmable logic arrays, gate arrays and die interconnect arrays. These arrays are utilized to provide options for the integrated circuit user between the standard high volume, low cost logic arrays and the very expensive handcrafted custom designed integrated circuits. These arrays allow a user to program the low cost array for the user's specific application at a substantially reduced cost from the cost of a custom application circuit.

One type of PROM switching element is shown in U.S. Pat. No. 4,146,902 in the name of Tanimoto. This patent illustrates a polycrystalline silicon resistor. The polycrystalline resistor is formed by high temperature, about 700° C., chemical vapor deposition (CVD) process. There are several apparent disadvantages to such a process and the resulting resistors. First, if a platinum silicide diode is utilized, the processing of the resistor at 700° C. potentially will destroy or seriously damage the platinum diode. Secondly, by its very nature, a polycrystalline structure has numerous and varied grain boundaries and other defects. This results in a wide distribution in switching levels, since each resistor will have different gain boundaries and defects and hence different switching characteristics. Thirdly, the polysilicon structure inherently is more conductive than an amorphous alloy and hence will be too conductive to be utilized with MOS devices which cannot withstand high current levels. The higher conductivity of the polycrystalline resistor also results in a relatively narrow range of doping and hence resistivity, so that the resistor switching parameters are not as flexible as desired.

Heretofore it has also been proposed to provide an EEPROM (electrically erasable programmable read only memory) device, a vertically disposed memory region or cell in a memory circuit which is vertically coupled at and between an upper Y axis conductor and a lower X axis conductor in a memory matrix. Such an EEPROM system provides a relatively high packing density. Examples of such EEPROM's are disclosed in U.S. Pat. No. 3,699,543 to Neale directed to: COMBINATION FILM DEPOSITED SWITCH UNIT AND INTEGRATED CIRCUIT and U.S. Pat. No. 4,177,475 to Holmberg directed to: HIGH TEMPERATURE AMORPHOUS MEMORY DEVICE FOR AN ELECTRICALLY ALTERABLE READ ONLY MEMORY.

These references illustrate EEPROM devices including a matrix of X and Y axis conductors where a memory circuit, including a memory region and an isolating device is located at each cross over point and extends generally perpendicularly to the cross over conductors thereby to provide a relatively high packing density.

The memory region utilized in such EEPROM devices have typically been formed of a tellurium-based chalcogenide material and more specifically an amorphous material such as amorphous germanium and tellurium. Other materials which have rather highly reversible memory regions include a $Ge_aTe_b$ wherein a is between 5 and 70 atomic percent and b is between 30 and 95 atomic percent. Some of these materials also include other elements in various percentages from 0 to 40 in atomic percent such as antimony, bismuth, arsenic, sulfur and/or selenium.

Amorphous materials of the type described above have good reversibility and have sufficient thermal stability such that they will not deteriorate under the usual temperature conditions, in which they are utilized. The crystalline state is reset into its amorphous state by a high resetting current.

A preferred EEPROM material has (a) good reversibility of up to or greater than $10^6$ cycles, (b) a maximum processing temperature of about 200° C., (c) a maximum storage temperature of about 100° C., (d) a threshold voltage of 8 volts, (e) a SET resistance of 300 ohms and (f) an OFF resistance (at 175° C.) of at least approximately $10^4$ ohms.

Heretofore it has also been known to provide isolating devices which are coupled in series with a memory region or cell between the cross over conductors, such isolating devices typically having been formed by diffusing various dopant materials into a single crystal silicon substrate to form a rectifier, transistor, or MOS device, e.g., a field effect transistor. Such a diffusion process results in lateral diffusion of the doped material into the substrate material and as a result the cell packing densities of such prior memory systems have been limited by the degree of lateral diffusion of the dopant materials and by the margin of error required for mask alignment.

Heretofore an all thin film EEPROM device has been proposed and is disclosed in U.S. Pat. No. 3,629,863 referred to above. The all film memory circuit disclosed in U.S. Pat. No. 3,629,863 utilizes deposited film bidirectional threshold type isolating devices.

The devices herein utilize for each isolating device a unidirectional isolating device like a rectifier or transistor which provides isolation by a high impedance P-N junction in one direction of current flow thereby to provide very high OFF resistance.

It has been proposed to form a P-N junction by vacuum depositing, either an N or P type amorphous semiconductor film on an oppositely doped silicon chip substrate. In this respect, reference is made to U.S. Pat. No. 4,062,034 which discloses such a thin film transistor having a P-N junction. It has not been proposed to use such a thin film deposited amorphous semiconductor film for forming an isolating device in a memory circuit which also includes a memory region in a programmable array.

Also, it has been previously proposed in parent application Ser. No. 201,594, to utilize an amorphous alloy which includes silicon and fluorine and which may also contain hydrogen to provide a thin film rectifier or transistor in the memory circuits of a programmable array. It also has heretofore been proposed to utilize silicon and fluorine materials in a solar cell which is essentially a photosensitive rectifier. In this respect, reference is made to the disclosure in U.S. Pat. No. 4,217,374, Stanford R. Ovshinsky and Masatsugu Izu entitled: AMORPHOUS SEMICONDUCTORS EQUIVALENT TO CRYSTALLINE SEMICONDUCTORS and U.S. Pat. No. 4,226,898, Stanford R. Ovshinsky and Arun Madan, of the same title.

SUMMARY OF THE INVENTION

The disadvantages of the prior art are overcome in accordance with the present invention by providing a programmable cell or antifuse having a non-volatile highly non-conductive state settable and non-resettable into a non-volatile highly conductive state. The cells can be utilized to replace the fuse links in programmable arrays such as PROM devices, logic arrays, gate arrays and die interconnect arrays to increase the programming reliability and packing density while substantially reducing the overall cost of the arrays.

The cells have a non-conductive state or OFF resistance of 10,000 to 1,000,000 ohms or more. The cells are settable into the conductive state by a threshold voltage of 8 to 20 volts or less, a programming current of about 10 to 25 milliamps for bipolar uses and a programming time of 1 to 100 microseconds or less. For MOS devices the doping and hence the programming current of the devices can be utilized to result in a range of 10 microamps to 1000 microamps. The cells have a maximum permittable processing temperature tolerance of 400° to 500° centigrade or more.

The cells are designed for high processing temperature, manufacturing and operating reliability and ease of manufacture including facilitating testing. The increase in these desirable characteristics over the EEPROM type chalcogenide materials are obtained by eliminating reversibility in the cells. In contrast to the reversibility of $10^6$ cycles in the EEPROM devices and the cells in copending Ser. No. 649,205, which generally have reversibility of 10 to 100 cycles or less, the improved cells in a normal operating environment are not resettable.

The cells are formed from doped silicon and hydrogen alloys which can include fluorine and can include some impurities, such as oxygen or carbon. The cells are doped with standard dopants, such as phosphorus or boron to contain about 0.1 to 5 percent dopant. The cells can be deposited by sputtering, low temperature chemical vapor deposition (CVD), evaporation (such as electron beam epitaxy) or by plasma deposition techniques. Reference can be made to the aforementioned U.S. Pat. Nos. 4,217,374 and 4,226,898 for such deposition techniques.

Each cell or antifuse is deposited in an array with an isolating device and associated addressing circuitry. The isolating devices and addressing circuitry can be bipolar or MOS devices or thin film diodes or transistors in MOS or V-MOS configurations or combinations thereof. The cells have a cell area of less than 1 square mil which provides a high cell packing density in the arrays.

DESCRIPTION OF THE PREFERRED EMBODIMENT

Figure 1:
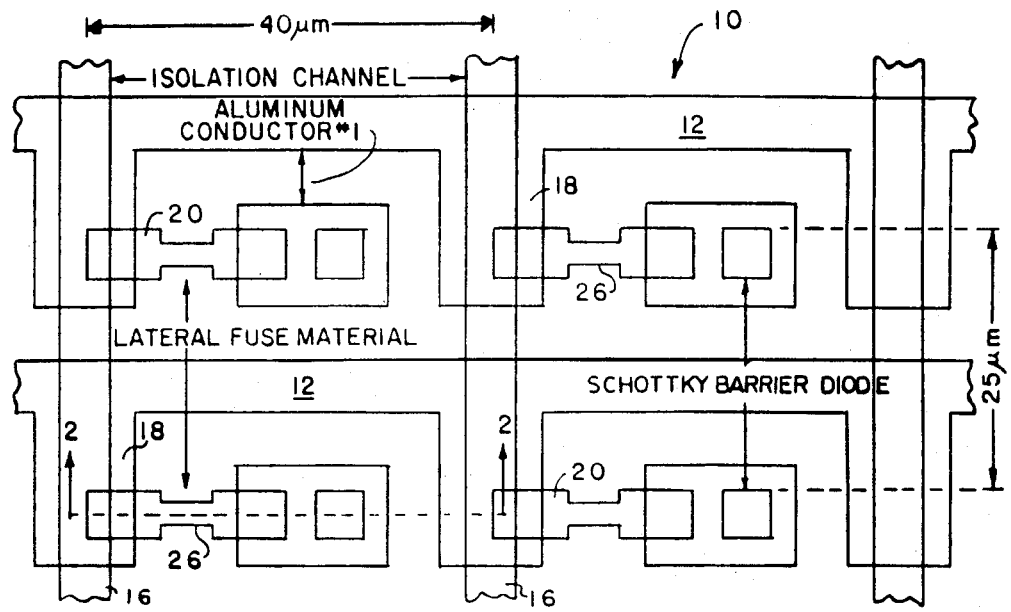
FIG. 1 is a fragmentary plan view of the deposited film side of a silicon chip substrate of a programmable array such as a memory matrix of a prior art fuse type PROM device.
Figure 2:
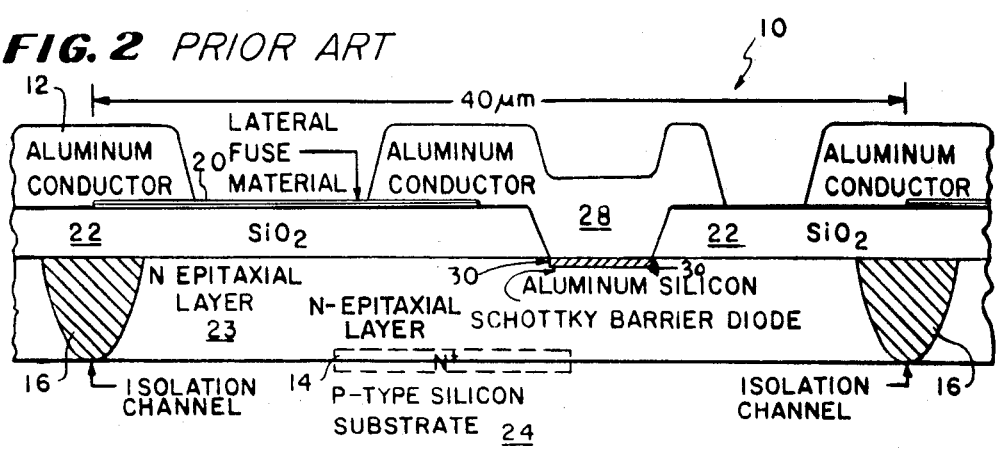
FIG. 2 is a sectional view through one memory circuit and fuse of the PROM device shown in FIG. 1 and is taken along line 2—2 of FIG. 1.

Referring now to the drawings in greater detail there is illustrated in FIGS. 1 and 2 a portion of a prior art programmable array such as a PROM device 10 including an X-Y memory matrix including X axis aluminum conductors 12 and Y axis N+ doped silicon conductors 14. As shown, the N+ doped silicon Y axis conductor 14 is separated from adjacent Y axis conductors 14 by isolation channels 16. The aluminum X axis conductor 12 has short legs 18 which extend in the Y direction to make contact with one side of a metallic fuse link 20.

As shown in FIG. 2, the fuse link 20 is deposited on a layer 22 of silicon oxide which in turn is deposited or grown on a layer 23 of N epitaxial material in which the isolation channel 16 is formed. The layer 23 is formed on a P type silicon substrate 24 and N doped Y axis conductor 14 is formed therebetween.

As best shown in FIG. 1, each fuse link 20 extends laterally and has a reduced width portion 26 which must have critical dimensions (thickness and width) in order to provide a fuse link which can be blown with a predetermined amount of current. The other side of the fuse link 20 on the layer 22 of $SiO_2$ has an aluminum conductor 28 deposited thereon. The $SiO_2$ layer first had been cut away so that an aluminum silicon Schottky barrier diode 30 can be formed at an exposed surface of the silicon substrate layer 24. Then the aluminum conductor 28 is deposited over the silicon oxide layer 22 and over the aluminum/silicon Schottky barrier diode 30 to form a conductive path from one side of the fuse link 20 to the barrier diode 30 which is electrically coupled to the N+ Y axis conductor 14. The fuse link 20 and the diode 30 form an array circuit 32 here a memory circuit.

Each of the crystal silicon substrates and devices formed thereon utilize conventional lithography processing steps except where specified otherwise. For example, in FIG. 2, the P-type substrate 24 has the X conductor or buried layer 14 deposited thereon utilizing photolithography to expose the desired areas. The layer 14 typically arsenic or phosphorus can be diffused by heat during processing or can be formed by ion implantation. The epitaxial N-layer 23 is then grown on the substrate 24 over the conductors 14. The isolation channels 16 can be junction or oxide channels. For a junction channel the layer 23 is masked and P-type material is deposited and diffused into the layer 23 down to the substrate 24. For an oxide channel the channels are masked and then partially etched into the layer 23 and then thermally oxidized to grow the channels down to the substrate 24.

For other devices in the array, a base typically P-type layer is then diffused into the layer 23 between the channels 16 for a diode or transistor, such as for the addressing circuitry or other programmable elements. Then a resistor diffusion step is performed. To form a transistor then an emitter step is performed by masking off a portion of the base diffusion areas and diffusing typically N-type material into it. The oxide layer 22 then is deposited over the entire layer 23 including the diffusion areas. Then with photolithography an oxide cut such as for the diode 30 is made through each portion of the oxide 23 where contact with the diodes, transistors, etc. is desired. Palalinum, palladium or aluminum is then sputtered or evaporated onto the oxide and exposed silicon areas which is then heat treated, such as at 450° centigrade for thirty minutes. This forms a metal silicide diode with the silicon but does not change the metal on the oxide layer 23. An etchant such as Aqua Regia is utilized to etch away the platinum from the oxide layer, but the metal silicides are not affected.

The fuse links 20 are then patterned and formed on the oxide 23. The fuse links of about 200 Angstroms are vertically and critically dimensioned. The conductors 12 and 28 are then patterned and laid down upon the oxide 22, fuse links 20 and diodes 30. An oxide layer (not shown) is then deposited over the whole array, which is then etched to make contact with the conductors (first metal) where desired. Then a second metal (not shown) is patterned onto the oxide and openings. Another oxide layer is then formed over the second metal, which oxide is etched to the second metal to form the array bonding pads in a conventional manner.

Figure 3:
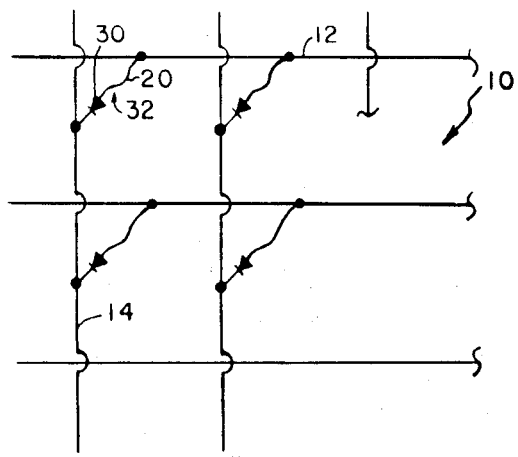
FIG. 3 is a schematic circuit diagram of a portion of the PROM device shown in FIG. 1.

The schematic circuit diagram of the prior art array device 10 is shown in FIG. 3.

From the foregoing description of the prior art array or PROM device 10 illustrated in FIGS. 1, 2 and 3, and from an inspection of FIGS. 1 and 2 it is readily apparent that the lateral disposition of the fuse link 20, the need for isolation channels 16 and the lateral arrangement of the Schottky barrier diode 30 create limitations on the packing density of the memory circuits 32 (memory cells) formed by each fuse link 20 and diode 30 located at and extending between the X and Y axis cross over conductors 12 and 14 at each cross over. As shown, the center-to-center distance between adjacent memory circuits 32 (cells) is typically 40 microns utilizing five micron lithography. The packing density and hence overall cell size is extremely important because the cost of the cell portion of the arrays is exponentially related to cell rate. A reduction in size of a factor of two is an effective cost reduction of a factor of five or six.

Figure 4:
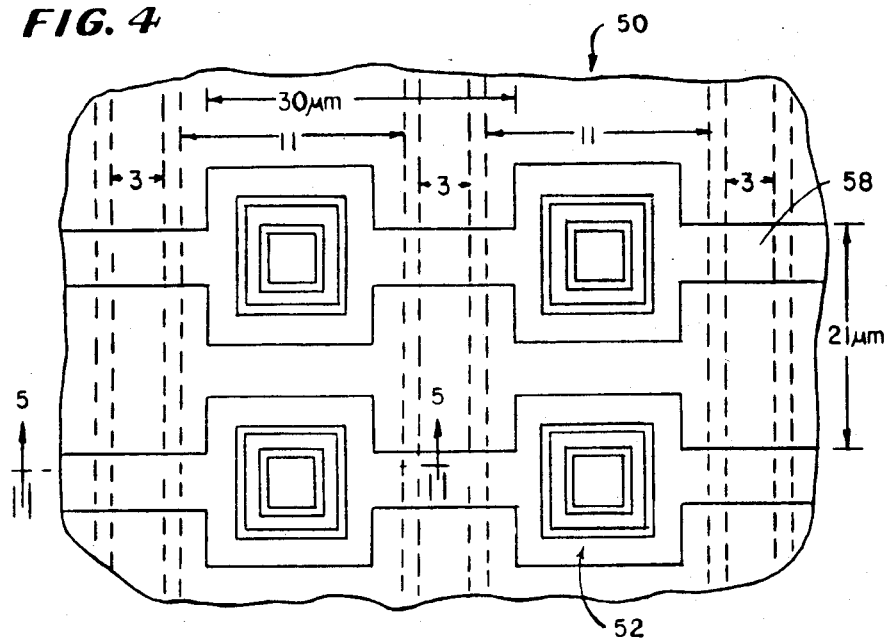
FIG. 4 is a fragmentary plan view of the deposited film side of a programmable array such as a PROM device which is made in accordance with the teachings of the present invention, which is deposited on a silicon chip substrate and which includes a plurality of memory circuits, each including an antifuse cell or memory region in series with an isolating Schottky barrier diode formed in the substrate.
Figure 5:
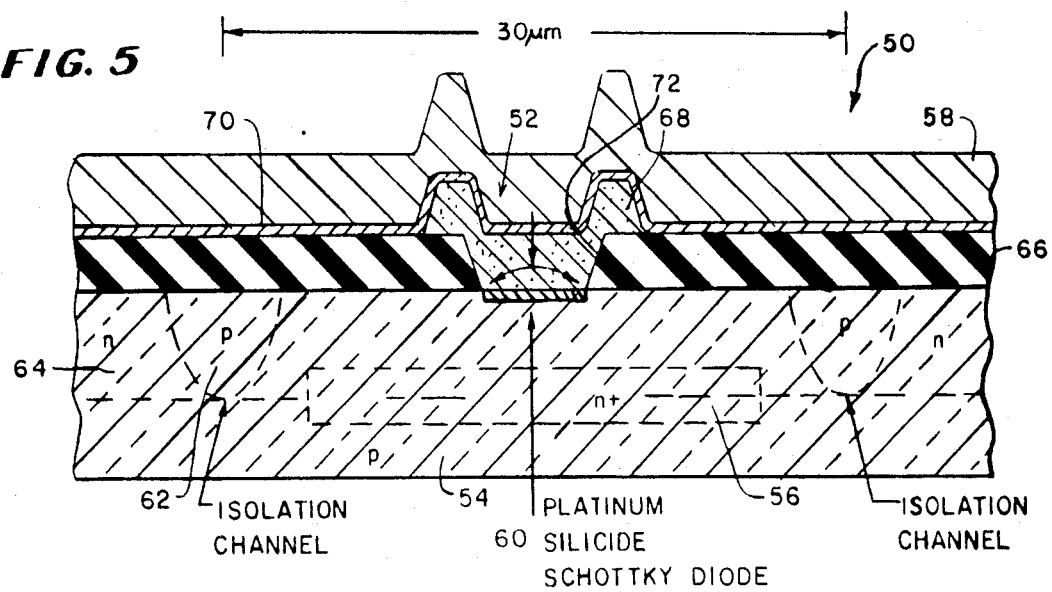
FIG. 5 is a sectional view through one cell or memory region and isolating device of a memory circuit shown in FIG. 4 and is taken along line 5—5 of FIG. 4.

Referring now to FIGS. 4 and 5 there is illustrated therein a portion of a programmable array 50 which can also be a PROM device, including a plurality of connection or memory circuits 52 constructed in accordance with the teachings of the present invention on a P type silicon substrate 54. As shown in FIG. 5, each circuit 52 extends between an N+ Y axis conductor 56 in the substrate 54 and an X axis metallic conductor 58 which can be made of suitable metal, such as aluminum.

Briefly, the circuit 52 includes a diode such as a platinum silicide Schottky diode 60 between isolation channels 62 in an N epitaxial layer 64 formed on the upper surface of the P type silicon substrate 54. Above the epitaxial layer 64 is a layer of insulating material 66 which can be silicon dioxide and which may be formed by chemical vapor, vacuum deposition, or thermal oxidation techniques. A portion of the layer of insulating material 66 is cut away above the platinum silicide Schottky diode 60 and a layer of phase change amorphous material 68 is deposited in the open space to form an antifuse cell or memory region 68 of the circuit 52. Above the cell 68 is a thin conductive barrier layer 70, preferably made of a refractory metal or metal alloy like Ti-W. Above this thin conductive barrier layer is the layer of highly conductive metal such as aluminum forming the X axis conductor 58.

The portion of the array 50 shown in FIGS. 4 and 5 is formed as described above on a selectively doped crystal semiconductor substrate 54 which can be a silicon chip. As stated above, the substrate 54 is shown as a P-type silicon substrate having the epitaxial layer 64 of N-type silicon formed on the top of the substrate 54. Also as shown, extending through the epitaxial layer 64 is a pair of isolation channels 62, one pair for each row of circuits 52 which serve to divide the epitaxial layer 64 into electronically isolated regions between which the epitaxial layer 64 forms part of the Y axis conductors 56 of the array.

Low resistance connections are made to the ends of the N+ Y axis conductors 56 in a conventional well-known manner by diffusing N+ regions into the epitaxial layer directly above the lower N+ regions. Conductors (not shown) may be added over insulating layers deposited over the sections shown in FIGS. 4 and 5 with conductive fingers making connection to spaced N+ diffused regions (not shown) between the various cells in each vertical row of cells shown in FIG. 4. This additional technique for lowering the resistance of the connections to the N+ Y axis conductors 56 are not shown to avoid unduly complicating the drawings.

Figure 13:
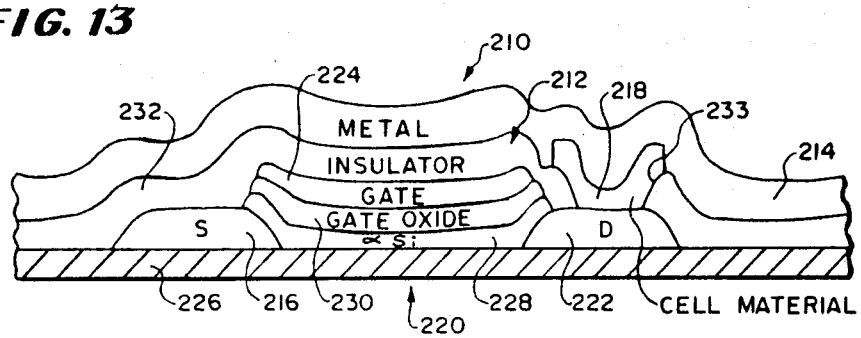
FIG. 13 is a sectional view through an all thin film deposited array cell including a circuit having a cell and a thin film, field effect transistor isolating device constructed in accordance with the teachings of the present invention.
Figure 14:
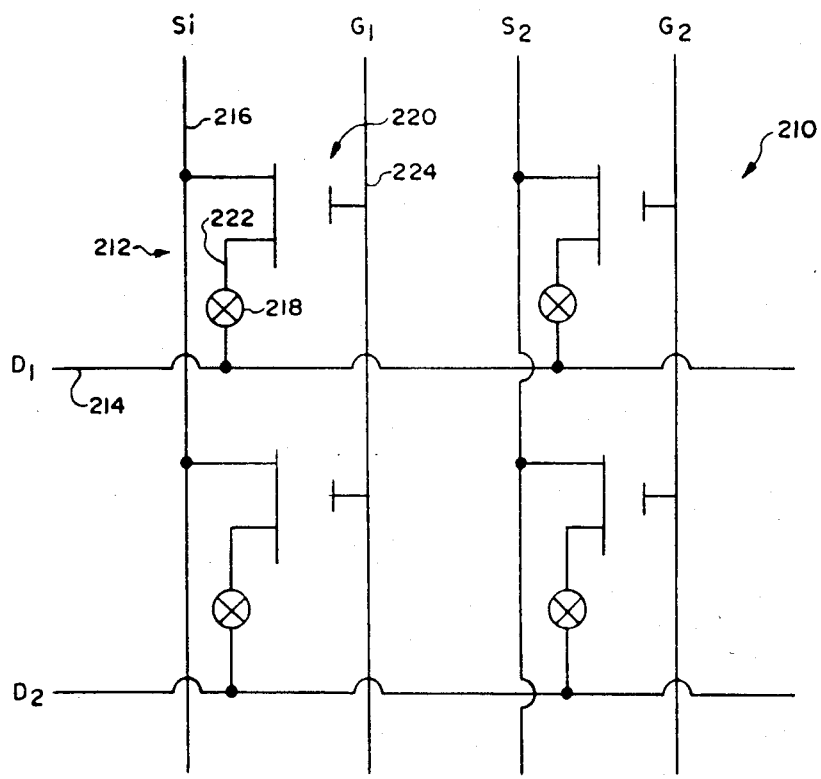
FIG. 14 is a schematic circuit diagram of a plurality of circuits shown in FIG. 13.

The lateral extent of each memory circuit which reduces the packing density is one reason why an all deposited film memory matrix of memory circuits to be described in connection with the description of FIG. 11 and utilizing a thin film rectifying device or a transistor isolating device as illustrated in FIGS. 13 and 14 has a much greater packing density than that readily achievable with the array shown in FIGS. 4 and 5. In this respect, the center-to-center distance between adjacent circuits or cells 52 is 30 microns which is, however, less than the 40 microns in distance for the cells in the prior art device 10 shown in FIGS. 1–3, utilizing the same lithography techniques for each device.

Further with respect to the formation of the memory circuit 52 shown in FIG. 5, the layer of insulating material 66 is formed by chemical vapor deposition, sputtering, plasma deposition or thermal oxidation techniques, in an opening 72 therein, under the memory region 68 which is formed using conventional photo-resist masking and etching techniques.

The barrier layer 70 serves to limit ionic migration from the aluminum layer forming the X axis conductor 58 which would tend to degrade the non-resettable amorphous material forming the cell 68 as well as exposed diodes 60 elsewhere in the array. In this way bands of aluminum forming the X axis conductors 58 make electrical connection through the underlying bands of barrier layer 70 to establish electrical contact with the cells 68 of the various circuits 52. The layer 70 also allows a higher processing temperature for the cells 68.

Setting or read current pulses are fed through selected circuits 52 by applying suitable threshold voltages of positive polarity across the X and Y axis conductors 58 and 56 so that current passes in a low resistance direction through the Schottky barrier diode 60 formed at the interface between the associated platinum silicide region and the epitaxial layer 64 below.

With the construction just described of a circuit 52, the packing density of the circuit 52 is limited by the spacing of the isolation channels 70 which as shown in FIG. 5 is approximately 30 microns. The distance of 30 microns between isolation channels is also the center-to-center distance between adjacent circuits 52 in the array 50. This distance, it will be noted, is less than the 40 micron distance between the isolation channels 70 in the conventional prior art device 10 utilizing a lateral fuse on a bipolar substrate as shown in FIGS. 1–3.

In accordance with the teachings of the present invention, the antifuse or memory region 68 is made of a settable non-resettable phase change material having desired thermal and electrical characteristics. In parent application Ser. No. 201,594, plasma or glow discharge silicon alloys formed from compound gases such as silane, silicon tetrafluoride and hydrogen are utilized as one embodiment of the phase change material. Such alloy materials deposited at temperatures below 400° C., in accordance with the teachings of U.S. Pat. Nos. 4,217,374 and 4,226,898 provide amorphous cells having the desirable PROM characteristics.

It has been discovered in accordance with the present invention that the silicon amorphous alloy cells can be improved by doping with conventional dopants. In a plasma deposition system the mixture, for example can be 20 to 150,000 ppm of phosphine ($PH_3$) or diborane ($B_2H_6$) in an argon carrier or diluent, with silane ($SiH_4$) or silicon tetrafluoride ($SiF_4$) and hydrogen. Typically about 15,000 ppm of the dopant is mixed with argon to provide about fifty percent of the gas mixture. A preferred gas mixture for bipolar applications is one (1) percent phosphine, forty-nine (49) percent argon and fifty (50) percent silane which results in an alloy having about two (2) percent phosphorus, ninety-three (93) percent silicon and five (5) percent hydrogen.

The addition of the dopant reduces the resistivity of the cell alloy. The doped alloy resistivity is about $10^4$ ohm-cm. Further, the dopant reduces the optical and electrical band gap of the cell alloy, typically about ten percent. This reduction reduces the magnitude of the breakdown field of the cell alloy. The lower field allows a thicker deposit of the cell alloy without raising the breakdown or threshold voltage of the resulting cell alloy.

The thicker cells can have a lower defect or pin hole density, i.e. the yield of operative cells is increased. The thicker cells also provide a more uniform array of threshold voltages, i.e. each cell will breakdown in a more narrow range of voltages. The undoped silicon alloy cells are deposited to a thickness of 500 to 1500 Å to breakdown at a threshold of 10 to 20 volts or less, while the doped cells are deposited to thicknesses of 1000 to 2000 Å to have the same breakdown voltages.

Figure 6:
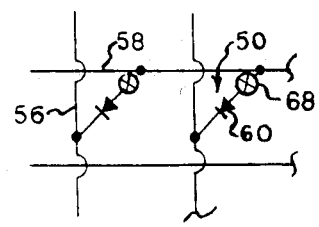
FIG. 6 is a schematic circuit diagram of a portion of the PROM device shown in FIG. 4.

The lower resistivity of the doped silicon alloy cells results in an increase in the leakage or pre-switching current which can be passed through the cells. Although this would appear to be detrimental, it instead allows for significant advantages in testing and utilizing the cell devices. Between about 0.1 and 1.0 ma of current can be passed through each of the cells 68 to test that the circuits and cells are functional. Referring to the schematic diagram in FIG. 6, this includes checking the lines 56 and 58 for an open circuit condition, and passing reverse current through the cells 68 to check the cells and the diodes 60.

The doping levels for cells utilized with MOS devices is less than that used for bipolar devices to reduce the magnitude of the switching current to the desired range of 10 to 1000 microamps.

Further, in manufacturing the arrays, the possible occurrence of pre-switching the cells because of the exposure to static electricity substantially is eliminated.

The doped silicon cell alloys also make ohmic contact to metals and metal silicides and hence the resistance of the programmed devices is lower and more consistent.

Furthermore, the addition of a dopant, such as phosphorus, to the silicon alloy makes the alloy more pliable and less susceptible to cracking during subsequent high temperature processing.

In forming cell 68, the opening 72 is first masked by a conventional photoresist. The amorphous phase change alloy then is deposited into the opening to the desired thickness. The deposition techniques can be those described in the above referenced U.S. Pat. Nos. 4,217,374 and 4,226,898. One exemplary deposition process is a plasma deposition from $SiH_4$ which can include a diluent such as argon gas in about a one to one ratio. The substrate is heated to below the melting temperature of the photoresist, for example less than 150° centigrade.

Between 1000 and 2000 angstroms of cell alloy is deposited at an operating frequency of about 30 kilohertz, with about 800 angstroms producing a threshold voltage of eight volts. The photoresist is then stripped off and the barrier layer 70 is deposited as previously described. Varying the thickness of the cell 68 varies the threshold voltage required to set the phase change material into the conductive state, as previously discussed.

Setting the amorphous alloy forming the cell region 68 into the crystalline-conductive state is typically accomplished by passing a current through the material having a value of between about 10 microamps and 25 milliamps with a threshold voltage of about 8 to 10 volts applied thereto for a period of between 1 and 100 microseconds.

The alloys described above provide cell or memory region materials which have a stable, highly conductive state and a stable, highly non-conductive state. The non-conductive state is non-resettably switchable into the stable, highly conductive state by applying a current limited voltage pulse or a voltage limited current pulse across the cell region exceeding a predetermined threshold level. The cell remains in the highly conductive state even in the absence of an applied voltage or current and under all operating conditions.

Figure 7:
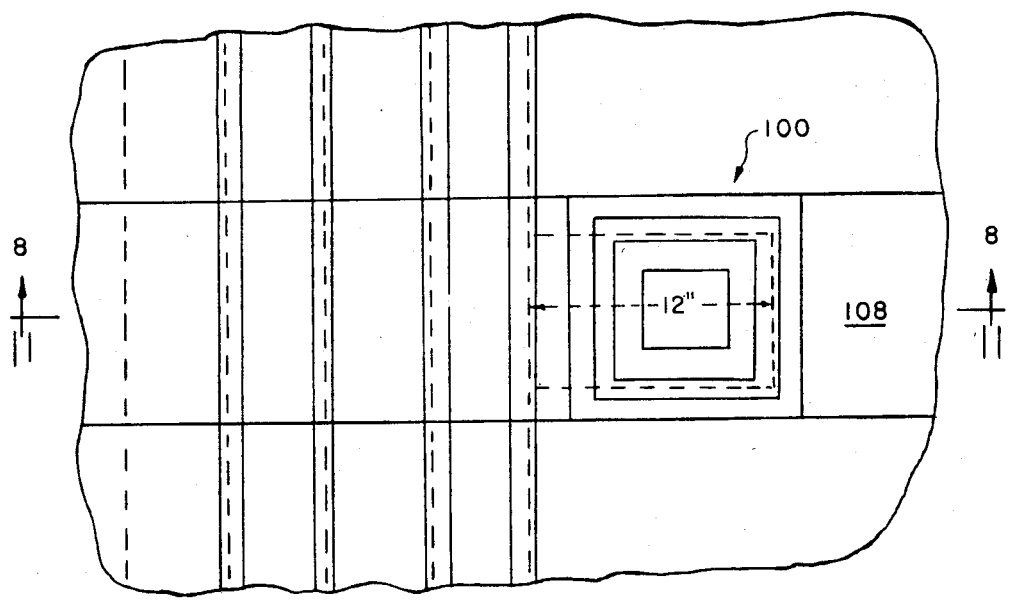
FIG. 7 is a fragmentary plan view of the deposited film side of a silicon chip substrate forming one cell of a programmable array constructed in accordance with the teachings of the present invention, the array including a plurality of memory circuits each having an antifuse cell or memory region in series with a field effect transistor type isolating device formed in the substrate.
Figure 8:
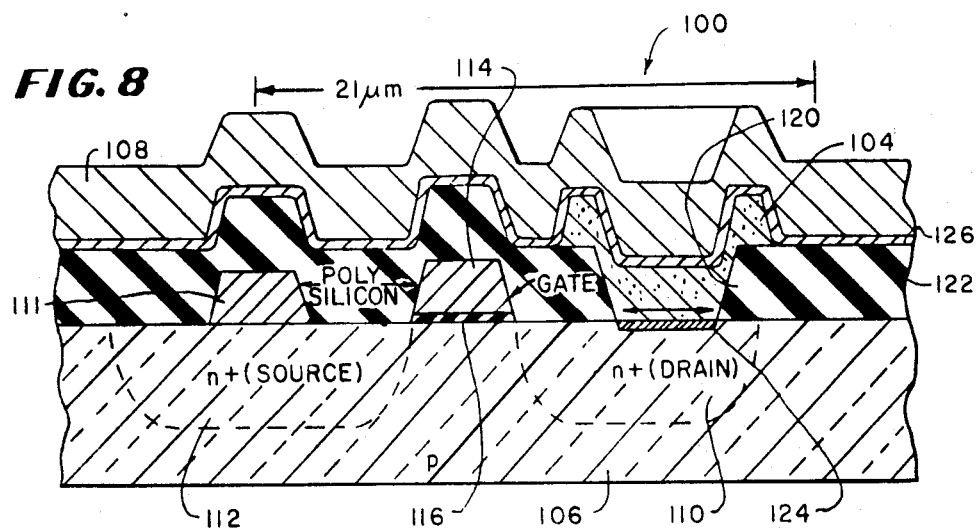
FIG. 8 is a sectional view of one memory circuit of the array shown in FIG. 7 and is taken along line 8—8 of FIG. 7.

Referring now to FIGS. 7 and 8, there is illustrated therein another embodiment of a programmable array 100 made in accordance with the teachings of the present invention. The array 100 includes circuits 102 each of which includes a cell 104 made of amorphous alloy material of the type described above and an isolating device 105 which is a field effect transistor device 105 of the MOS type which is formed in a P-type silicon substrate 106 on which circuits 102 are formed.

The array 100 includes an X axis aluminum conductor 108 which is connected to one side of the cell or memory region 104. The other side of the cell is coupled to an N+ diffused drain-forming region 110 in the substrate 106. The substrate 106 has a Y axis conductor 111 thereon above a source region 112 of the field effect transistor 105 diffused in the substrate 106. In addition, a Y axis gate forming conductor 114 is deposited on an insulating layer 116 on top of the substrate 106.

As shown, in the construction of the array 100 including the cell 104 and field effect MOS-type transistor 105 is formed in the substrate 106. Spaced apart parallel N+ conductivity bands 110 and 112 are diffused in the upper region of the substrate 106 thereby to form respectively parallel MOS-type device source-forming regions 112 and drain-forming regions 110 each of which is used in common with a circuit 102.

Continuing the formation of the circuit 102, parallel gate insulating regions are formed on the substrate 106, such as the gate insulating layer 116. Such insulating layer may be silicon oxide or silicon nitride.

Using a suitable photo-resist masking and etching technique, the Y-axis conductor 111 is formed for making electrical connection to the source-forming region 112 and the Y-axis gate-forming conductor 114 is formed by vacuum depositing or otherwise on the insulating layer 116. Such conductors 111 and 114 can be formed of various materials and are typically formed of polysilicon. Low resistance connections are made to the Y axis conductor 111 and Y axis gate conductor 114 in a conventional manner.

Continuing with the formation of the array 100, an insulating layer 122 is now vacuum deposited or otherwise formed on the top surface of the substrate 106, and a portion thereof is cut away to leave an open area 120 above the drain regions 110. A layer of platinum is then deposited in the open area between portions of the layer of insulator 122 and on the top surface of the substrate 106 which is then heated to form a platinum silicide region 124 forming an ohmic (rather than a Schottky barrier diode) region. An etchant like Aqua Regia is then used to remove the excess platinum, but not the platinum silicide region 124. A layer of the memory material 104 is then deposited in and about each opening 120 in the layer of insulating material 122 so as to make good electrical contact with the platinum silicide region 124. A thin barrier layer 126 is then deposited over the insulating layer 122 and the drain region material 104, such thin barrier 126 preferably being made of a material-like Ti-W. Then a thicker layer of conductive metal such as aluminum is deposited to form the X axis conductor 108.

As shown in FIG. 8, this array 100 including a cell region 104 made of amorphous alloy material of the type described above and a MOS-type field effect transistor 105 forming the isolating device of the memory circuit 102 has a lateral extent of 21 microns which is very much smaller than the 40 microns of the prior art lateral fuse-type PROM device 10 shown in FIGS. 1 and 2.

Figure 9:
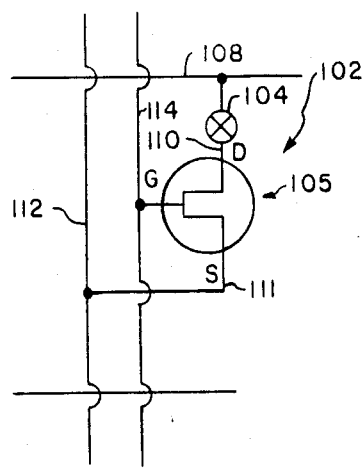
FIG. 9 is a schematic circuit diagram of a portion of the array shown in FIG. 7 and shows a memory circuit of the PROM device.

A schematic equivalent circuit of the circuit 102 shown in FIG. 8 is illustrated in FIG. 9.

Figure 10:
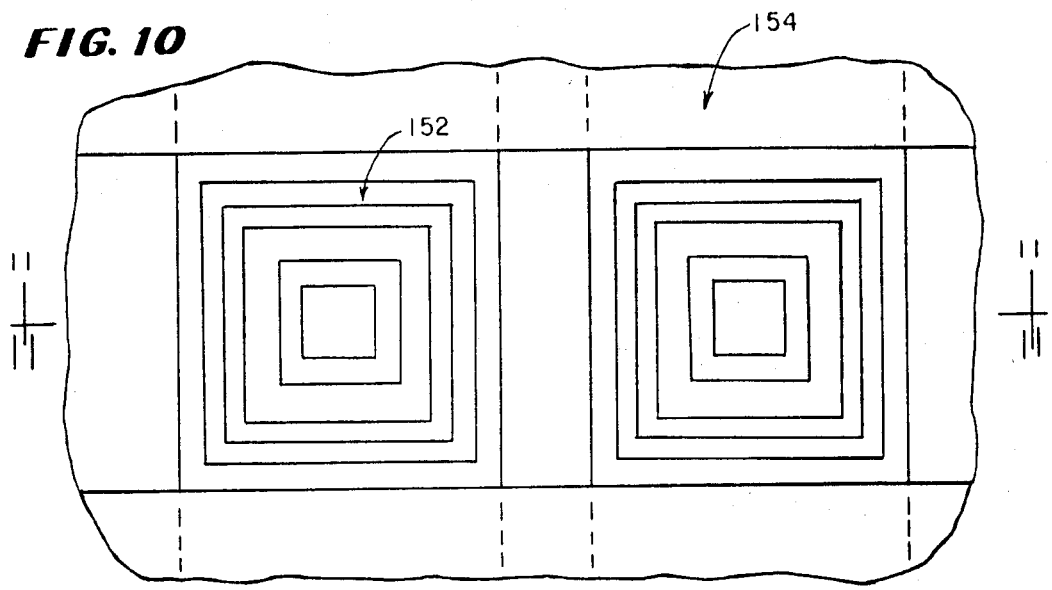
FIG. 10 is a fragmentary plan view of the deposited film side of a substrate of an array including a plurality of array circuits each having a cell or memory region and an isolating device that are formed with thin film depositing techniques in accordance with the teachings of the present invention.
Figure 11:
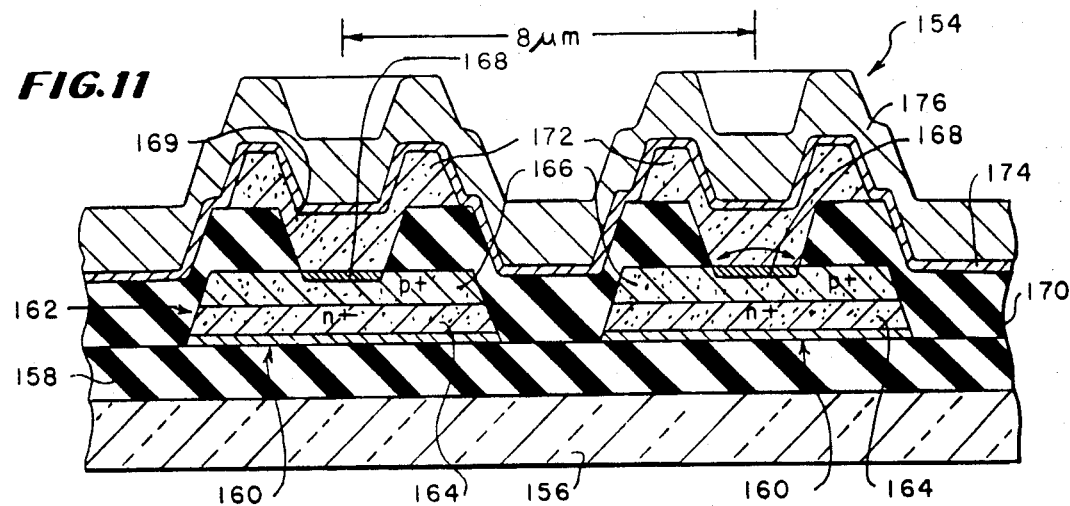
FIG. 11 is a sectional view through the array shown in FIG. 10 and is taken along line 11—11 of FIG. 10.

Referring now to FIGS. 10 and 11, there is illustrated therein two cells in an all-deposited thin film array 154 which eliminates the previously described diffusion channels. As shown, the circuits 152 of the PROM device 154 are formed on a main substrate 156 illustrated in FIG. 11. On top of this main substrate is deposited a layer of an insulating material 158. In this respect, the main substrate material 156 can be a metal substrate and the insulating layer 158 can be very thin so that heat generated in other portions of the memory circuits 152 deposited on the insulating layer 158 can be dissipated in the heat sink formed by the metal substrate 156. Such insulating layer 158 can be made of silicon dioxide. On top of the layer of insulating material 158 are deposited parallel conductor bands 160 which form the Y axis conductors 160 of the memory matrix of the array 154.

A P-N junction device made of layers of amorphous semiconductor material or alloy is deposited on top of the conductor bands 160. In this respect, an isolating rectifier device 162 is formed from successively doped N+ and P+ layers 164 and 166 of amorphous alloy. Then a layer of insulating material 170 is deposited over the substrate 158 and the layers of material 160, 164 and 166 thereon. Next, an open space 169 is cut out in the area where the platinum silicide region 168 is to be formed and such platinum silicide region 168 is formed in the manner described above.

Then the phase change non-resettable amorphous alloy is deposited to form a cell or memory region 172 in the manner described above. Then, a thin layer of refractory barrier-forming material like molybdenum or a TiW alloy 174 is deposited on the insulating layer 170 and the memory regions 172. Next, a thicker layer 176 of conductive metal such as aluminum is deposited over the refractory barrier-forming layer 174 to form an X axis conductor 176. The platinum silicide region 168 may form an ohmic contact or Schottky barrier interface with a lightly doped outer amorphous alloy layer.

As shown in FIG. 11, the center-to-center distance between the all-film deposited circuits 152 is 8 microns which provides a very high packing density, e.g., a memory cell density of approximately 0.1 mil$^2$. This is accomplished as shown in FIG. 11 and as described above by having each circuit extend substantially vertically between the X axis conductor 176 and the Y axis conductor 160.

The diode 162 utilized as an isolating device can have a first region and a second region, the regions abutting each other to form a junction therebetween and the first region being made of an amorphous alloy including silicon and fluorine. Preferably, the amorphous material also contains hydrogen and is amorphous $Si_aF_bH_c$ where a is between 80 and 98 atomic percent, b is between 0 and 10 atomic percent and c is between 0 and 10 atomic percent. The amorphous material or alloy of the diode 162 can be formed in a manner described in U.S. Pat. Nos. 4,217,374 and 4,226,898. It appears that the silicon alloy material cells 172 have a large resistance and also form one or more reverse biased diodes to that of diode 162, allowing them to be set without affecting the forward biased diode 162.

The first region of amorphous alloy in the diode can be doped with a dopant material chosen from an element of Group V of the Periodic Table such as, for example, phosphorus or arsenic, and an amount of dopant material constituting between a few parts per million and five atomic percent. Preferably, the first region is doped by amount of dopant material constituting 10 to 100 parts per million.

The second region can be a metal, a metal alloy or a metallic like material having a high barrier height on the first region so as to create a Schottky barrier. Such a metal can be chosen from the group consisting of gold, platinum, palladium or chrome.

The amorphous alloy of the first region can alternatively be doped with a dopant material chosen from an element of Group III of the Periodic Table such as boron or aluminum in an amount constituting between a few parts per million and five atomic percent.

Also alternatively, the second region can be made of a material dissimilar to the amorphous alloy material such as to form a heterojunction.

Figure 12:
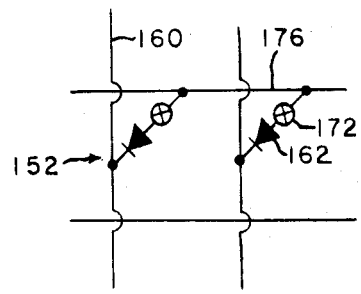
FIG. 12 is a schematic circuit diagram of the array circuits shown in FIGS. 10 and 11.

FIG. 12 illustrates a schematic diagram of the circuits shown in FIGS. 10 and 11.

Referring now to FIGS. 13 and 14, there is illustrated therein another programmable array 210 which includes a circuit 212 extending between an X axis metal conductor 214 and a Y axis conductor 216. As shown, in this embodiment, the circuit 212 includes a cell or memory region 218 having the amorphous alloy material therein and an isolating device 220 which is a thin film, field effect transistor 220.

As shown, the conductor 216 is a band of conductive material forming a source region 216 for the thin film transistor which also includes a drain region 222 and a gate conductor 224.

In forming the circuit 212, a band of source material 216 is first laid down on an insulated or insulator substrate 226. The material of which the band of source material 216 is made can be a metal (as shown), an N doped semiconductor alloy, or a P doped semiconductor alloy. After the band of source material 216 has been laid down on the substrate 226, regions of drain material 222 are deposited on the substrate 226. Again, the regions 222 of drain material can be made of a metal (as shown), an N doped semiconductor alloy material or a P doped semiconductor material. Next, a layer 228 of amorphous silicon alloy which preferably contains hydrogen and/or fluorine is deposited on the substrate 226 between the source band forming conductor 216 and the drain region 222.

Again, this amorphous silicon alloy is preferably amorphous $Si_aF_bH_c$ where a is between 80 and 98 atomic percent, b is between 0 and 10 atomic percent and c is between 0 and 10 atomic percent.

After the amorphous silicon layer 228 has been laid down, a layer of gate insulating material such as a gate oxide 230 is laid down on top of the amorphous silicon layer 228. Next a layer of gate conductor material 224 is laid down in a band extending parallel to the band 216 on top of the gate insulating material. The gate conductor 224 can be made of a metal (as shown), an N doped semiconductor or a P doped semiconductor. Next, a layer of insulating material 232 is laid down over the substrate 226, the band of source material 216, the layers 228, 230 and 224 described above and the regions 222 of drain material. Next, the insulating material above the drain region is removed to form an opening 233 in which is deposited a layer of cell material 218. Lastly, a band of material, typically a metal such as aluminum, is laid down over the insulating material 232 and in contact with the memory region 218 and parallel to the X axis to form the X axis conductor 214. A barrier layer (not shown) can be deposited before the conductor 214.

A schematic circuit diagram of some of the circuits 212 of the array 210 is illustrated in FIG. 14.

It will be noted that the circuit 212 of the array 210, by reason of the spacing of the source region 216 from the drain region 222 has a greater lateral extent than the circuits 152 wherein the regions 164 and 166 of the diode 162 are in line or stacked in line with the memory region 172 between the X axis conductor 176 and the Y axis conductor 160. Nonetheless, where MOS-type field effect transistors are desired for use as the isolating device, the array 210 is preferred.

From the foregoing description it is apparent that the cell of the present invention having the silicon alloy amorphous phase change material which has desirable thermal and electrical characteristics as described above, in conjunction with one of several isolating devices, provides programmable arrays which can be easily set in a minimum amount of time, provide a circuit which has low set current, a fast setting time, a high processing temperature, a relatively high storage temperature, a low SET resistance and a high OFF resistance.

Also, the isolating devices can be of conventional single crystal silicon bipolar Schottky diode type or bipolar P-N junction type. Alternatively, such devices can be of the MOS-type, either the planar MOS type or the V-MOS type. Additionally, and preferably, the isolating devices are formed by a thin film depositing technique and in a most-preferred form the diode or field effect transistor forming the isolating device is made of an amorphous vacuum deposited silicon alloy which also contains hydrogen and/or fluorine. The all thin film circuit formed arrays are preferred since they have the highest packing density and at the same time provide an array with a non-resettable phase change material cell and thin film diodes or transistors that are vertically arranged between crossover X and Y axis conductors at the crossover points.

Figure 15:
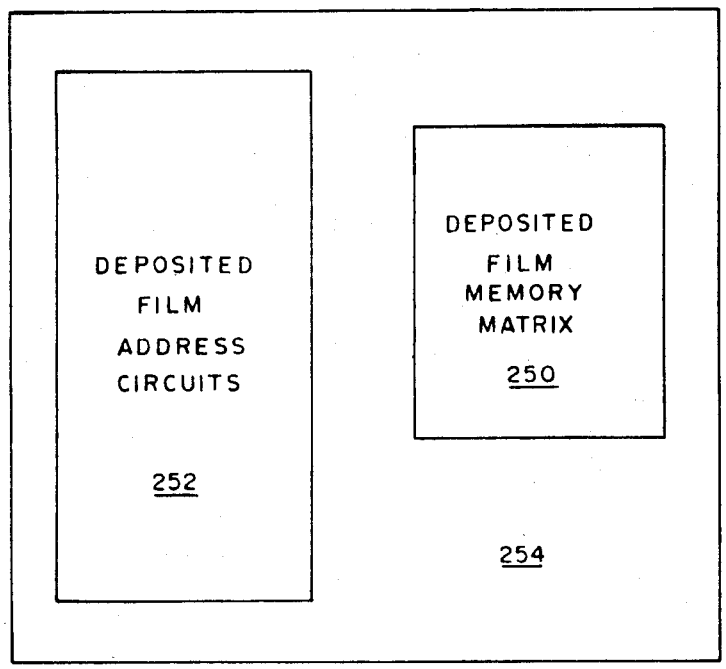
FIG. 15 is a plan view of a substrate or a portion thereof upon one side of which are deposited array circuits, such as memory circuits which are all thin film deposited, memory regions and isolating devices, together with addressing circuitry which is formed by thin film deposition techniques.

In addition, it will be apparent that the various arrays having the various cell configurations illustrated in the previous figures can be utilized with addressing circuitry which select a particular X or Y axis conductor for supplying setting or reading currents and such addressing circuitry can be formed by deposited films. In this respect, an all deposited film memory matrix for example and addressing circuitry is deposited on the same substrate as illustrated diagramatically in FIG. 15 and includes a memory matrix or array 250 with associated addressing circuitry 252 deposited on a substrate 254. Also it is to be noted that the addressing circuitry 252 and the memory matrix 250 can be deposited on the same side of the substrate 254 or on opposite sides of the substrate 254. Additionally, the array and the memory matrix 250 can be partially or all thin film deposited in the manner described above. Preferably, however, in addition to forming the memory region of each memory circuit in a thin-film manner from an amorphous alloy material, the isolating devices and the addressing circuitry 252 are also formed by a thin-film depositing technique.

Since most presently utilized data storage and handling systems operate through integrated circuits formed in silicon chip substrates, it is believed that the initially marketed arrays made according to the teachings of the present invention, would probably have memory matrices where some portion of the memory matrix involved such as the isolating device and/or addressing circuitry utilized therewith will be formed within a silicon chip substrate.

Figure 16:
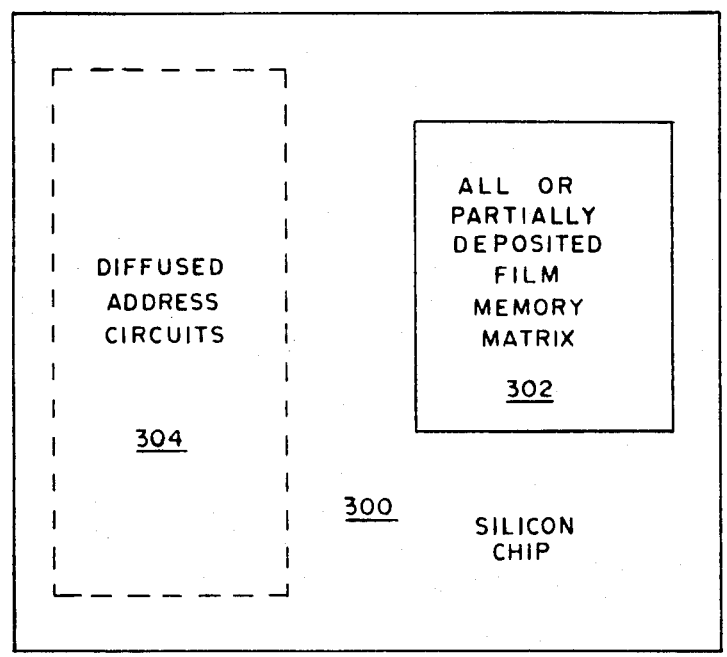
FIG. 16 is a plan view of a silicon chip or portion thereof wherein the array circuits are all or partially thin film deposited memory regions and isolating devices together with addressing circuitry formed on the chip by doped and diffused regions within the silicon chip substrate.

In FIG. 16 there is diagramatically illustrated a silicon chip substrate 300 with an all or partially deposited thin film memory matrix or array 302 having memory circuits therein and associated addressing circuitry 304 which are incorporated into the silicon chip substrate 300 by forming the various elements of the circuit from dopant-diffused areas therein.

It is to be noted that an all thin film array including circuits formed in accordance with the teachings of the present invention and utilizing thin film deposited isolating devices, together with addressing circuitry formed by thin film depositing technique provides substantial advantages since a number of such memory systems can be stacked one above the other with insulating layers separating the same. Also, thin metal, heat sink-forming substrates can be provided between insulating layers and have heat radiating fins on the outer edges thereof.

From the foregoing description, it will be apparent that the arrays 50, 100, 154 or 210 disclosed herein having incorporated therein conventional or new thin-film deposited isolating devices and utilized with conventional or new thin-film deposited addressing circuitry provide a number of advantages, some of which have been described above and others of which are inherent in the arrays of the present invention. Most importantly, such arrays can be made with a material having desirable thermal and electrical characteristics with extremely high packing densities of the cells and with a very high OFF resistance.

Many modifications and variations of the present invention are possible in light of the above teachings. For example, the amorphous cells such as 68, can have numerous sizes and shapes and could be deposited in the form of the fuse link 20. (By the term "amorphous" is meant an alloy or material which has long range disorder, although it can have short or intermediate order or even contain at times crystalline inclusions). Further, the cells such as 68, do not have to be deposited on top of the diode layers but can instead be between the two metal layers 58 and the second metal layer (not shown). Also the cell 218 could be between the gate 224 and the X conductor 214. It is therefore, to be understood that within the scope of the appended claims the invention can be practiced otherwise than as specifically described.

What is claimed and desired to be secured by Letters Patent of the United States is:

1. An improved programmable cell comprising:
an amorphous cell body, said body including at least a portion having a doped amorphous silicon alloy therein which is settable and non-resettable, said alloy portion having a highly nonconductive state settable into a highly conductive state.
2. The cell according to claim 1 wherein:
said alloy portion is settable into said conductive state by a threshold of ten volts or less.
3. The cell according to claim 1 wherein:
said alloy portion is settable into said conductive state by a programming current of twenty-five milliamps or less.
4. The cell according to claim 1 wherein:
said alloy portion in said highly conductive state has a resistance of one hundred ohms or less.
5. The cell according to claim 1 wherein:
said alloy portion in said highly nonconductive state has a resistance of ten thousand ohms or greater.
6. The cell according to claim 1 wherein:
said alloy portion in said highly nonconductive state has a resistance of one million ohms or greater.
7. The cell according to claim 1 wherein:
said cell body has a maximum permittable processing temperature tolerance of four to five hundred degrees centigrade or greater.
8. The cell according to claim 1 wherein:
said cell body has a long term storage temperature of two hundred degrees centigrade or greater.
9. The cell according to claim 1 wherein:
said alloy portion is settable into said conductive state in one hundred microseconds or less.
10. The cell according to claim 1 wherein:
said alloy portion is settable into said conductive state in ten microseconds or less.
11. The cell according to claim 1 wherein:
said alloy portion is settable into a crystalline highly conductive state.
12. The cell according to claim 1 wherein:
said alloy portion includes one tenth to five percent phosphorus dopant.
13. The cell according to claim 1 wherein:
said alloy portion also includes one or more of the group consisting of fluorine, hydrogen and oxygen.
14. The cell according to claim 13 wherein:
said alloy portion is formed by plasma deposition from a plasma containing at least silicon, hydrogen and 20 to 150,000 ppm of dopant.
15. A programmable electronic array comprising:
a plurality of amorphous cell bodies, each of said bodies including at least a portion having a doped amorphous silicon alloy therein which is settable and non-resettable, said alloy portion having a highly non-conductive state settable into a highly conductive state.
16. The array according to claim 15 wherein:
each of said cells is formed on a substantially planar substrate, each of said cells coupled between at least a pair of conductors and formed in a substantially perpendicular direction to said planar substrate to provide a high cell packing density on said substrate.
17. The array according to claims 15 wherein:
each of said cells includes means for isolating said cells from at least a pair of conductors.
18. The array according to claim 17 wherein:
each cell including said isolating means has a cell area of less than one square mil.
19. The array according to claim 17 wherein:
said isolating means include bipolar rectifying means formed by single crystal techniques.
20. The array according to claim 19 wherein:
said bipolar rectifying means include a Schottky diode.
21. The array according to claim 17 wherein:
said isolating means include rectifying means having at least first and second regions, said regions abutting one another and forming a junction therebetween, at least one of said regions being formed from an amorphous material including at least silicon.
22. The array according to claim 21 wherein:
the second one of said regions is formed from a metal, metal alloy or a metallic-like material forming a Schottky barrier with said first region.
23. The array according to claim 15 wherein:
each of said cells is a thin film deposited cell.
24. The array according to claim 17 wherein:
each of said isolating means include a field effect transistor.
25. The array according to claim 24 wherein:
each of said field effect transistors is a planar-MOS type transistor.
26. The array according to claim 24 wherein:
each of said field effect transistors is a V-MOS type transistor.
27. The array according to claim 24 wherein:
each of said transistors is a thin film amorphous transistor formed from at least silicon.
28. The array according to claim 17 wherein:

said isolating means are coupled to bipolar addressing means formed by single crystal techniques.

29. The array according to claim 17 wherein:
said isolating means are coupled to MOS addressing means.

30. The array according to claim 17 wherein:
said isolating means are coupled to thin film amorphous transistor addressing means.

31. The array according to claim 15 wherein:
said plurality of cells are stacked in at least two groups one upon another.

32. The array according to claim 15 wherein:
each of said cell bodies also includes at least one of the group consisting of fluorine, hydrogen and oxygen.

33. The array according to claim 15 wherein:
said cells form the programmable cells in a PROM device.

34. The array according to claim 15 wherein:
said cells form at least some of the fuse elements in a programmable logic array.

35. The array according to claim 15 wherein:
said cells form at least some of the fuse elements in a gate array.

36. The array according to claim 15 wherein:
said cells form at least some of the die interconnection elements in a set of integrated circuits.

37. The array according to claim 15 wherein:
said alloy portion includes one tenth to five percent phosphorus dopant.

* * * * *

UNITED STATES PATENT AND TRADEMARK OFFICE
CERTIFICATE OF CORRECTION

PATENT NO. : 4,499,557
DATED : February 12, 1985
INVENTOR(S) : S.H. Holmberg and R.A. Flasck It is certified that error appears in the above-identified patent and that said Letters Patent is hereby corrected as shown below:

Col. 2, line 65, delete "gain" and insert --grain--;
    Col. 3, line 43, after "conditions" delete ",";
    Col. 7, line 13, delete "Palalinum" and insert --Platinum--; and
    Col. 7, line 51, delete "rate" and insert --area--.

Signed and Sealed this

Seventeenth Day of December 1985

[SEAL]

Attest:

DONALD J. QUIGG

Attesting Officer     Commissioner of Patents and Trademarks